United States Patent
Ikeyama et al.

(10) Patent No.: US 11,412,647 B2
(45) Date of Patent: Aug. 9, 2022

(54) ELECTRONIC COMPONENT MOUNTING MACHINE

(71) Applicant: FUJI CORPORATION, Chiryu (JP)

(72) Inventors: Jo Ikeyama, Nagoya (JP); Motoshi Mizuno, Inazawa (JP)

(73) Assignee: FUJI CORPORATION, Chiryu (JP)

( * ) Notice: Subject to any disclaimer, the term of this patent is extended or adjusted under 35 U.S.C. 154(b) by 103 days.

(21) Appl. No.: 16/615,456

(22) PCT Filed: Jun. 14, 2017

(86) PCT No.: PCT/JP2017/021944
§ 371 (c)(1),
(2) Date: Nov. 21, 2019

(87) PCT Pub. No.: WO2018/229892
PCT Pub. Date: Dec. 20, 2018

(65) Prior Publication Data
US 2020/0178428 A1    Jun. 4, 2020

(51) Int. Cl.
*H05K 13/04* (2006.01)
(52) U.S. Cl.
CPC ..... *H05K 13/0413* (2013.01); *H05K 13/0419* (2018.08); *H05K 13/0409* (2018.08)
(58) Field of Classification Search
CPC .......... H05K 13/0413; H05K 13/0419; H05K 13/0409
See application file for complete search history.

(56) References Cited

U.S. PATENT DOCUMENTS

| 4,245,385 A * | 1/1981 | Zemek ............... H05K 13/0473 |
| | | 29/564.8 |
| 4,312,109 A * | 1/1982 | Kawana ............. H05K 13/0421 |
| | | 29/564.6 |

(Continued)

FOREIGN PATENT DOCUMENTS

| JP | 4-188896 A | 7/1992 |
| JP | 2013-162103 A | 8/2013 |

(Continued)

OTHER PUBLICATIONS

International Search Report dated Sep. 12, 2017 in PCT/JP2017/021944 filed on Jun. 14, 2017.

*Primary Examiner* — Peter Dungba Vo
*Assistant Examiner* — Jose K Abraham
(74) *Attorney, Agent, or Firm* — Oblon, McClelland, Maier & Neustadt, L.L.P.

(57) ABSTRACT

An electronic component mounting machine including a component supply device to supply a radial lead component to a supply position by feeding a carrier tape holding multiple radial lead components; and a component transfer device to collect the radial lead component supplied to the supply position and mount the radial lead component to a predetermined mounting position. The component supply device includes a locking section engageable with the feed holes of the carrier tape, and a tape feed section for feeding the carrier tape by sliding the locking section in engagement with the feed hole. The component transfer device includes a component holding section to hold the component main body of the radial lead component held by the carrier tape, and a position control section to control the position of the component holding section when holding the component main body.

3 Claims, 10 Drawing Sheets

(56) References Cited

U.S. PATENT DOCUMENTS

| | | | | |
|---|---|---|---|---|
| 5,024,129 A * | 6/1991 | Holcomb | ........... | H05K 13/0092 |
| | | | | 83/107 |
| 6,336,266 B1 * | 1/2002 | Kobayashi | ......... | H05K 13/0408 |
| | | | | 29/741 |
| 2012/0317802 A1 * | 12/2012 | Yamamoto | ......... | H05K 13/0215 |
| | | | | 29/832 |
| 2018/0332745 A1 * | 11/2018 | Kondo | ............... | H05K 13/0408 |

FOREIGN PATENT DOCUMENTS

| | | | | | |
|---|---|---|---|---|---|
| JP | 2013179190 A | * | 9/2013 | ............. | H05K 13/04 |
| JP | 2016040854 A | * | 3/2016 | | |
| JP | 6131006 B2 | * | 5/2017 | | |
| KR | 20140037747 A | * | 3/2014 | ............. | H05K 13/04 |
| WO | WO-2017090131 A1 | * | 6/2017 | ............. | H05K 13/04 |

* cited by examiner

ELECTRONIC COMPONENT MOUNTING MACHINE

TECHNICAL FIELD

The present application relates to an electronic component mounting machine.

BACKGROUND ART

As a component to be mounted on a board by an electronic component mounting machine, a radial lead component having a component main body and leads extending downward from the component main body are known. The radial lead component is such that the leads are held by a carrier tape and a tape feeder feeds the radial lead component to a supply position by performing a feeding operation on the carrier tape. The radial lead component supplied to the supply position is held by a component holding section, and the component holding section attaches the radial lead component, removed from the carrier tape, to the board.

For example, Patent Document 1 discloses a technique of holding a component main body of a radial lead component with a suction nozzle which is a component holding section. Patent Document 2 discloses a technique of holding leads of a radial lead component with a transfer claw which is a component holding section.

PATENT LITERATURE

Patent Document 1: JP-A-2013-162103
Patent Document 2: JP-A-H4-188896

BRIEF SUMMARY

Technical Problem

In regard to the radial lead component held on the carrier tape, the length from the upper end of the carrier tape to the lower end face of the component main body varies from carrier tape to carrier tape. With respect to the technique described in Patent Document 1, the variation in the length from the upper end of the carrier tape to the lower end face of the component main body causes an error when the component main body of the radial lead component is held by the component holding section.

It is an object of the present specification to provide an electronic component mounting machine capable of minimizing errors that occur when a radial lead component is held.

Solution to Problem

The present specification discloses an electronic component mounting machine comprising: a component supply device configured to supply a radial lead component to a supply position by feeding a carrier tape holding multiple radial lead components, each radial lead component consisting of a component main body and leads extending downward from the component main body; and a component transfer device configured to collect the radial lead component supplied to the supply position and mount the radial lead component to a predetermined mounting position. The carrier tape includes multiple feed holes at intervals in the longitudinal direction; the component supply device comprises a locking section engageable with the feed holes, and a tape feed section configured to feed the carrier tape by sliding the locking section in engagement with the feed holes; and the component transfer device comprises a component holding section configured to hold the component main body of the radial lead component held by the carrier tape, and a position control section configured to control the position of the component holding section when holding the component main body, wherein the position control section calculates the position of the component holding section when a component main body is held based on actual measurements of the length from the upper end to the lower end of the component main body and the length from the lower end of the component main body to the center of the feed hole.

Advantageous Effects

With the present disclosure, the position control section calculates the position of the component holding section when holding the component main body based on the length from the upper end to the lower end of the component main body and the actual measured value of the length from the lower end of the component main body to the center of the feed hole. As described above, the electronic component mounting machine can accurately set the position of the component holding section when a component main body is held by performing a simple setting of the position control section, and thereby minimize the occurrence of an error when a radial lead component is held.

DESCRIPTION OF EMBODIMENT

1. Schematic Configuration of Electronic Component Mounting Machine 1

An embodiment to which an electronic component mounting machine disclosed in this specification is applied will be described below with reference to the drawings. First, with reference to FIG. 1, a schematic configuration of electronic component mounting machine 1 according to an embodiment will be described.

Figure 1:
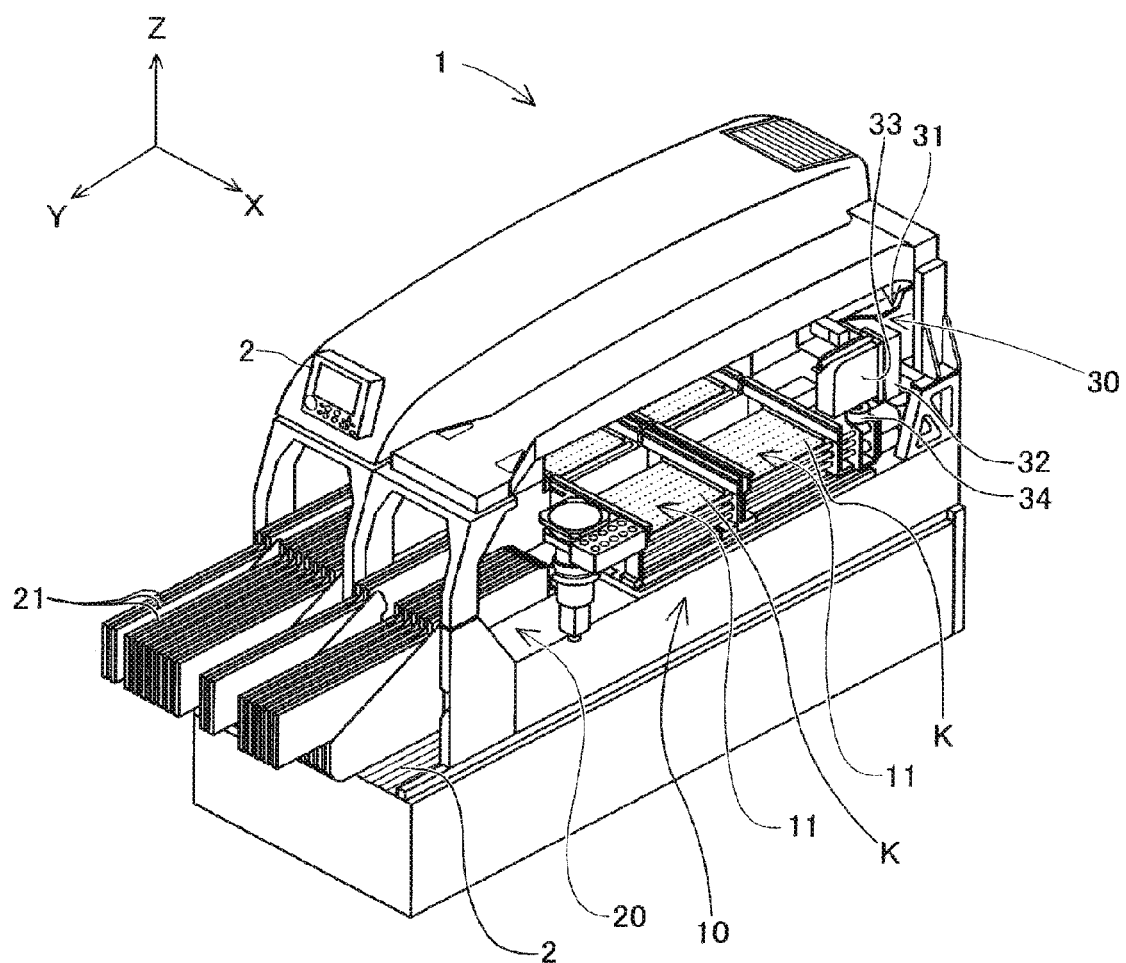
FIG. 1 A perspective view of an electronic component mounting machine according to an embodiment of the present disclosure.

As shown in FIG. 1, component mounting machine 1 mainly includes board conveyance device 10, component supply device 20, and component transfer device 30. Board conveyance device 10 is a device for conveying board K in the X-axis direction. Board conveyance device 10 is of a so-called double conveyor type in which two conveyance devices 11 are arranged in parallel. In conveyance device 11, a pair of guide rails are arranged in parallel along the X-axis direction, a pair of conveyor belts (not shown) are rotatably provided on the guide rails, and the conveyor belts convey board K by board K being placed thereon and the conveyor belts rotating. Board conveyance device 10 positions board K conveyed to the predetermined position, and when the mounting process of the component to board K is completed, board K is carried out to the outside of component mounting machine 1.

Component supply device 20 is of a cassette type in which multiple tape feeders 21 are arranged in parallel on a base frame, and each tape feeder 21 is detachably mounted to base frame 2. Tape feeder 21 feeds radial lead component 110 (see FIG. 2) held on carrier tape 100 to a supply position and removes radial lead component 110 from carrier tape 100 at the supply position. Details of tape feeder 21 will be described later.

Figure 2:
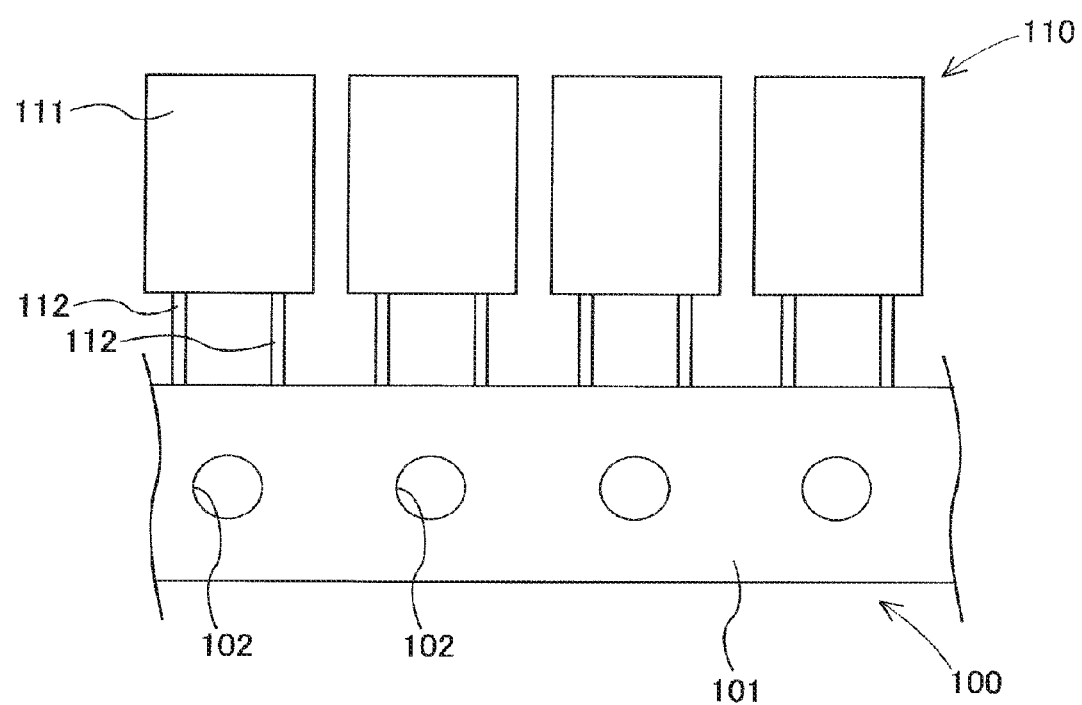
FIG. 2 A partially enlarged view of a carrier tape and radial lead components held by the carrier tape.

Carrier tape 100 and radial lead component 110 will now be described with reference to FIG. 2. As shown in FIG. 2, carrier tape 100 is formed by attaching two long tape members 101, and radial lead component 110 is held between the two attached tape members 101. Carrier tape 100 is provided with multiple feed holes 102, the feed holes 102 penetrating carrier tape 100 at regular intervals in the longitudinal direction.

Radial lead component 110 includes component main body 111 and two leads 112 extending downward from the lower face of component main body 111. Multiple radial lead components 110 held by carrier tape 100 are disposed at equal intervals so as to straddle feed holes 102 between the two leads 112 of each radial lead component 110.

Returning to FIG. 1, the description is continued. Component transfer device 30 collects radial lead component 110, supplied from component supply device 20 to the supply position, and mounts radial lead component 110 to a predetermined mounting position on positioned board K. Component transfer device 30 mainly includes head driving device 31, moving table 32, mounting head 33, component holding section 34, and position control section 35. Head driving device 31 is configured to move moving table 32 in the X-axis direction and the Y-axis direction by a linear movement mechanism, and mounting head 33 is configured to be detachable from moving table 32. Mounting head 33 is supported so as to be rotatable about an axis parallel to the Z-axis and is supported so as to move up and down in the Z-axis direction. Component holding section 34 is a suction nozzle capable of holding radial lead component 110 by suction. Component holding section 34 is detachably mounted on mounting head 33 and is supported by mounting head 33 so as to be rotatable about an axis parallel to the Z-axis and capable of moving up and down in the Z-axis direction.

Figure 3:
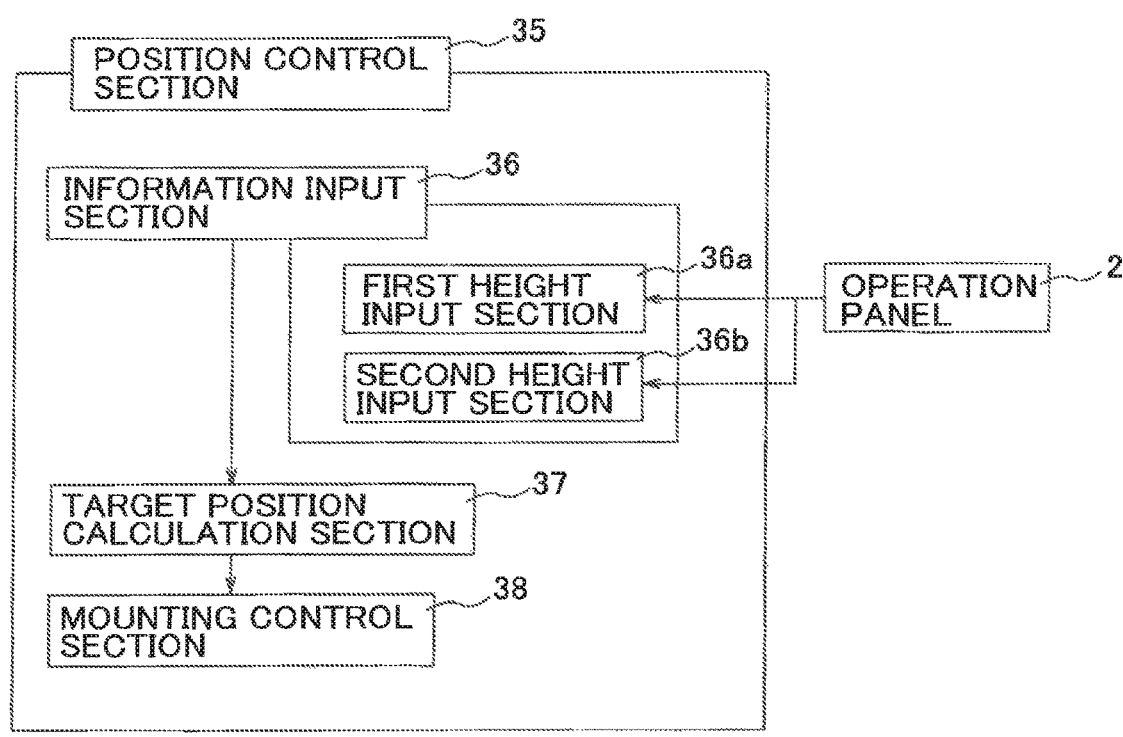
FIG. 3 A block diagram of a position control section.

As shown in FIG. 3, position control section 35 sets a target position for component holding section 34 upon holding radial lead component 110 and controls various motors so that component holding section 34 moves to the target position. Position control section 35 mainly includes information input section 36, target position calculation section 37, and mounting control section 38.

Information input section 36 receives information outputted from various sensors provided in component mounting device 1 and results of various recognition processes. Information input section 36 includes first height input section 36a and second height input section 36b. Numerical values relating to the height of radial lead component 110 held on carrier tape 100 is inputted to first height input section 36a and second height input section 36b by the operator. Specifically, the length from the upper end to the lower end of component main body 111 (hereinafter referred to as "first height H1") is inputted to first height input section 36a, and the length from the lower end of component main body 111 to the center of feed hole 102 (hereinafter referred to as "second height H2") is inputted to second height input section 36b.

Based on first height H1 and second height H2 inputted to information input section 36, target position calculation section 37 calculates the target position for component holding section 34 to be moved upon holding radial lead component 110. Mounting control section 38 controls the position and operation of component transfer device 30 based on the target position calculated by target position calculation section 37, other information inputted to information input section 36, a control program stored in advance, and the like.

2. Details of Tape Feeder 21

Figure 6:
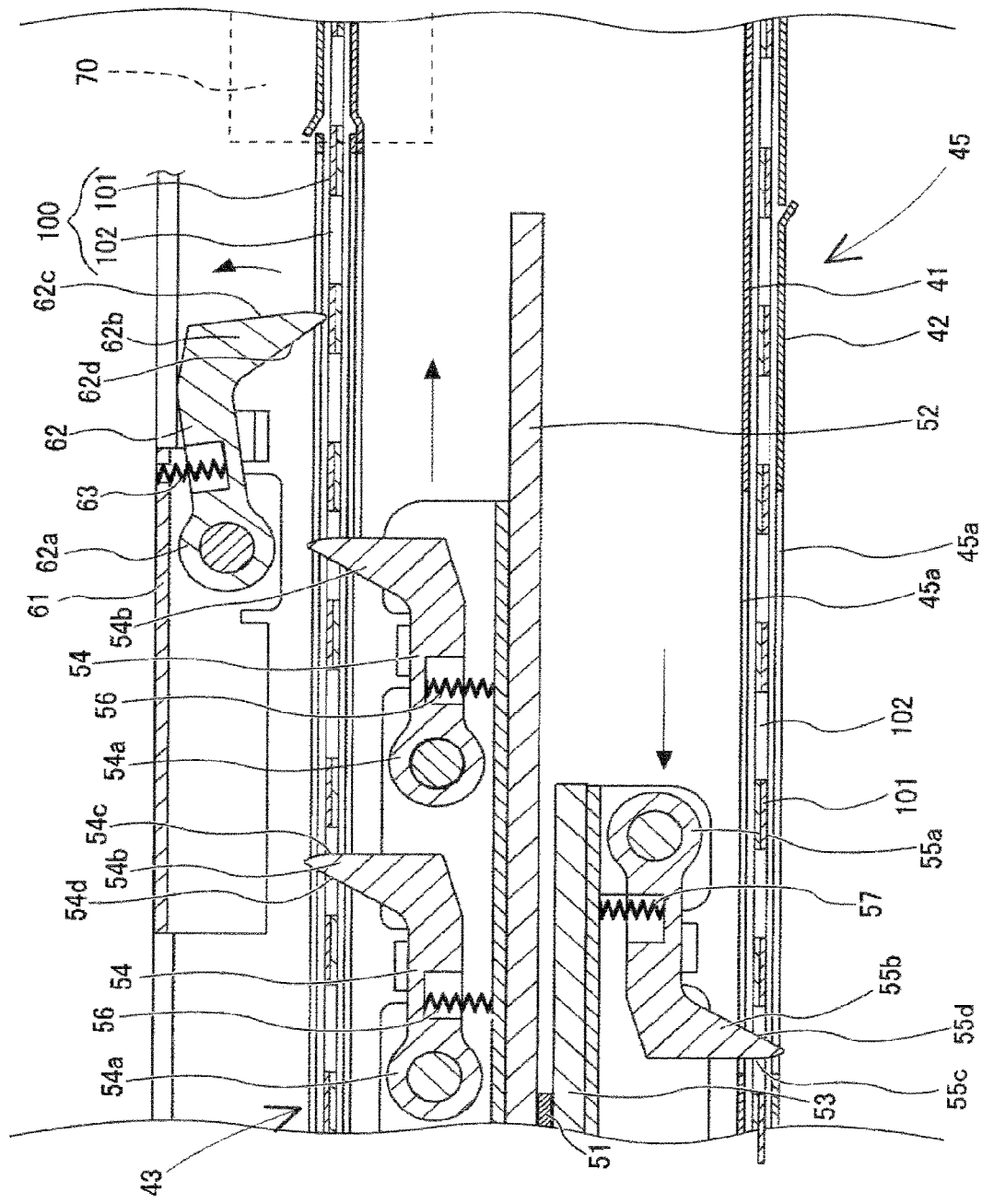
FIG. 6 A partially enlarged plan view of the tape feeder, showing an enlargement of portion A of FIG. 5, which is a view showing a process of performing, from the state shown in FIG. 5, the feeding operation of the carrier tape by a first locking section and a second locking section.
Figure 7:
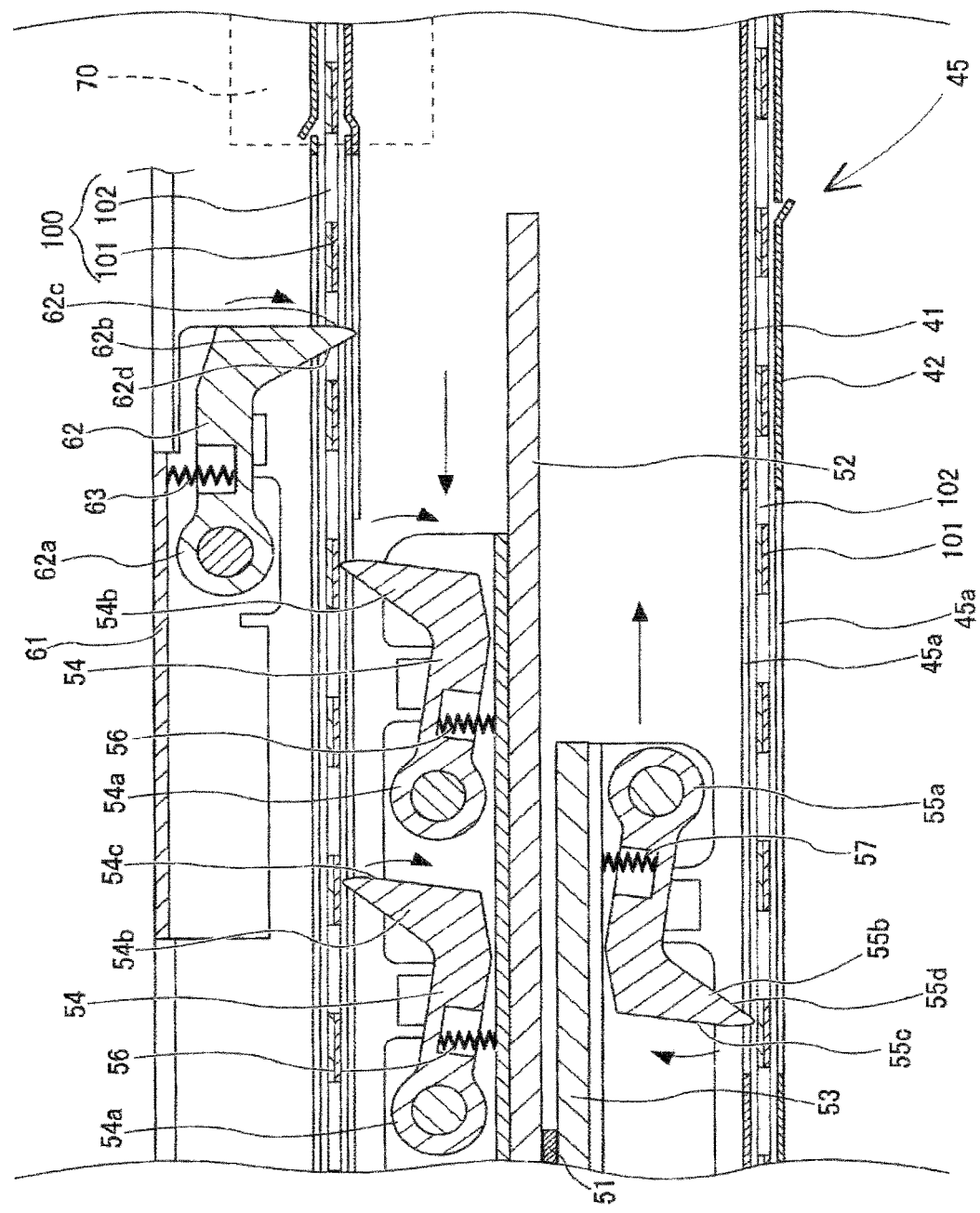
FIG. 7 A partially enlarged plan view of the tape feeder, showing an enlargement of portion A of FIG. 5, which is a view showing a process of performing, from the state shown in FIG. 6, a process of returning the first locking section and the second locking section to their original positions.

Next, tape feeder 21 will be described with reference to FIGS. 4 to 7. Tape feeder 21 feeds carrier tape 100 in order to supply radial lead component 110 held by carrier tape 100 to the supply position. As shown in FIGS. 4 to 7, tape feeder 21 mainly includes guide section 40, tape feeding section 50, and tape return prevention section 60. In FIGS. 6 and 7, radial lead component 110 held by carrier tape 100 is not shown.

Figure 4:
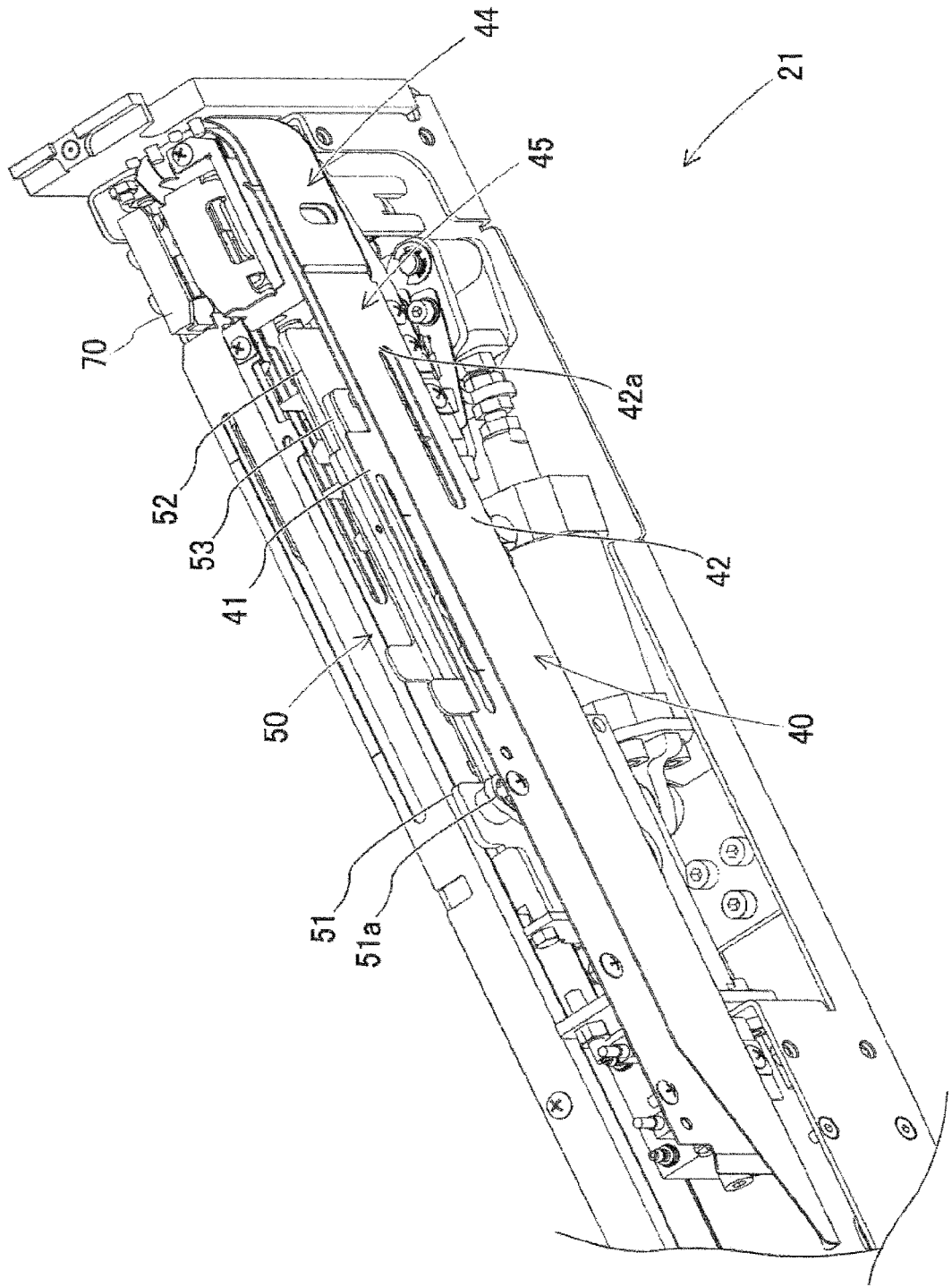
FIG. 4 A perspective view of a distal end of a tape feeder.
Figure 5:
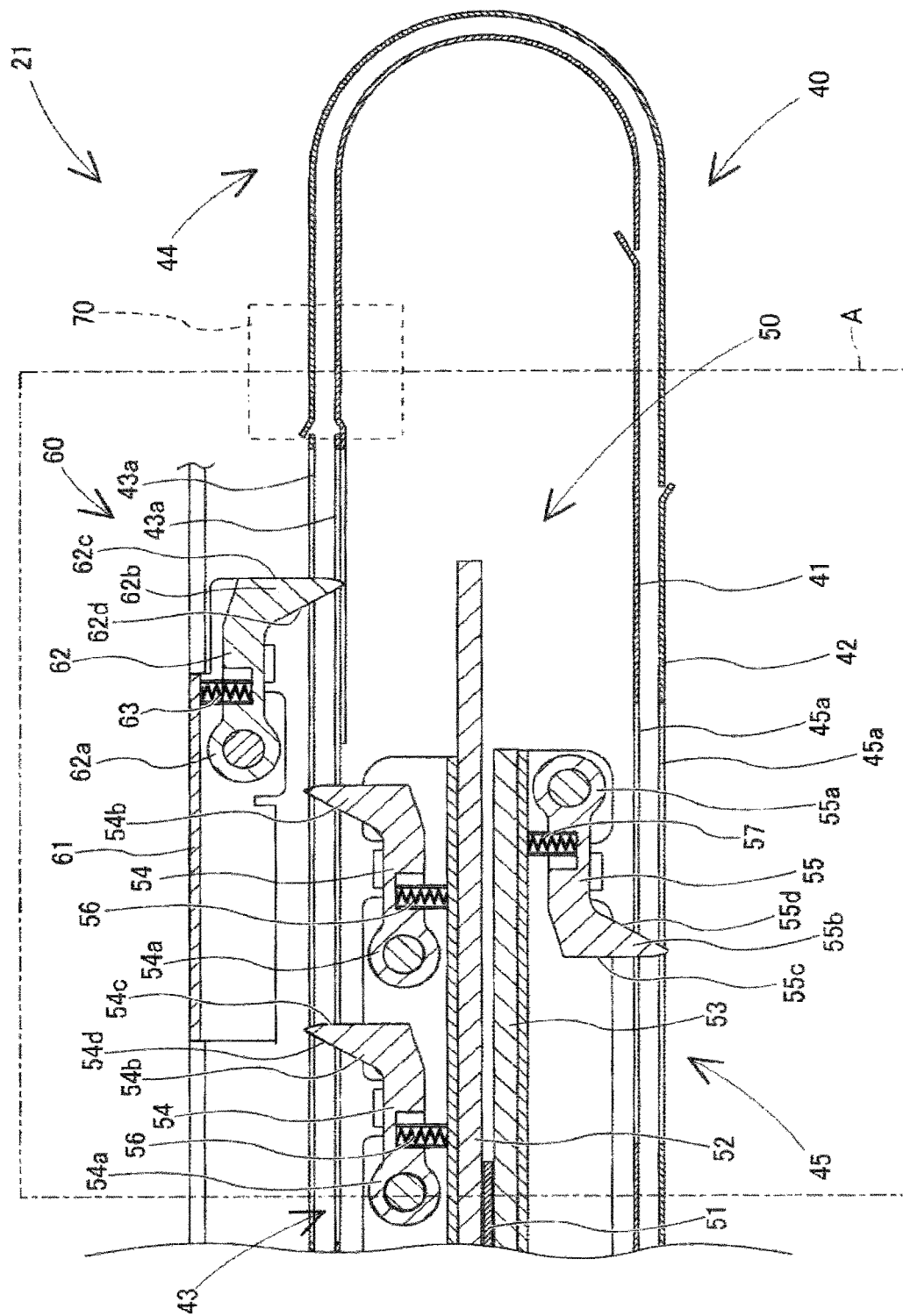
FIG. 5 A partially enlarged plan view of the tape feeder.

Guide section 40 is provided on the distal end of tape feeder 21, that is, on the upper right side of FIG. 4. Guide section 40 is formed by inner wall section 41 and outer wall section 42. Inner wall section 41 and outer wall section 42 are members having a substantially U-shaped form in plan view. Outer wall section 42 is provided on the outer side of inner wall section 41, and a gap capable of accommodating carrier tape 100 in an upright state exists between inner wall section 41 and outer wall section 42.

Guide section 40 includes feed-side guide 43, curved guide 44, and return-side guide 45, and feed-side guide 43 and return-side guide 45 are coupled via curved guide 44. Feed-side guide 43 is a portion that is substantially straight in plan view and is a portion of guide section 40 that is upstream from the supply position. Cutting device 70 for cutting radial lead component 110 held by carrier tape 100 and removing radial lead component 110 from carrier tape 100 is provided at the supply position provided at the downstream end of feed-side guide 43.

Curved guide 44 is a substantially U-shaped portion which is formed downstream from feed-side guide 43 in guide section 40 in plan view, and return-side guide 45 is a substantially straight portion which is formed downstream from feed-side guide 43 in guide section 40 in plan view. Curved guide 44 and return-side guide 45 guide carrier tape 100, from which radial lead component 110 has been removed at the supply position, to the outside of component supply device 20.

In inner wall section 41 and outer wall section 42, feed-side slit 43a extending along the X-axis direction is formed at a portion where feed-side guide 43 is formed. Similarly, return-side slit 45a extending along the X-axis direction is formed in a portion where return-side guide 45 is formed in inner wall section 41 and outer wall section 42.

Tape feeding section 50 feeds carrier tape 100 accommodated in guide section 40. Tape feeding section 50 mainly includes first fixed section 51, first slider 52, second slider 53, two first locking sections 54, and second locking section 55.

First fixed section 51 is a plate-like member provided in an upright state inside inner wall section 41. First slider 52 and second slider 53 are disposed on both sides with sandwiching first fixed section 51, and are supported by first fixed section 51 so as to be slidable in the X-axis direction. Pivot member 51a is pivotably supported in first fixed section 51, and first slider 52 is connected to one end of pivot member 51a, and second slider 53 is connected to the other end of pivot member 51a sandwiching the pivot rotation axis. Thus, first slider 52 and second slider 53 are configured to slide in opposite directions with respect to first fixed section 51.

Two first locking sections 54 are provided such that a space is left between the two first locking sections 54 in the X-axis direction. Both first locking sections 54 are disposed between first slider 52 and inner wall section 41, each first locking sections 54 being swingable about an axis parallel to the Z-axis direction with respect to first slider 52, and slide integrally with first slider 52 in the X-axis direction with respect to first fixed section 51. Each first locking section 54 and first slider 52 are connected via spring 56, and spring 56 biases first locking section 54 in a direction away from first slider 52.

First locking section 54 includes pivot support section 54a and claw section 54b. Pivot support section 54a is a portion on one end in the longitudinal direction of first locking section 54 and is attached to first slider 52 so as to be swingable about an axis parallel to the Z-axis direction. Claw section 54b is a portion formed on the other end in the longitudinal direction of first locking section 54 and protrudes toward the side opposite to first slider 52.

Claw section 54b includes locking surface 54c and lock-release surface 54d. Locking surface 54c is a portion of the side face of claw section 54b that is oriented toward the supply position and is substantially orthogonal to the X-axis direction during normal operation shown in FIG. 5. Lock-release surface 54d is a portion of the side surface of claw section 54b that is facing the side opposite to the supply position and slopes toward first slider 52 as it moves away from locking surface 54c in the X-axis direction.

Each of claw sections 54b provided in two first locking sections 54 is inserted into feed-side slit 43a during normal operation, and first locking sections 54 slide in the X-axis direction in a state in which claw sections 54b are inserted into feed-side slit 43a from the inner wall section 41 side. Each claw section 54b is pulled out of feed-side slit 43a by pivoting first locking section 54 against the urging of spring 56. The distance between claw sections 54b provided in two first locking sections 54 corresponds to twice the distance between feed holes 102 in carrier tape 100.

Second locking section 55 is disposed between second slider 53 and inner wall section 41. Second locking section 55 is supported by second slider 53 so as to be pivotable about an axis parallel to the Z-axis direction, and slides in the X-axis direction integrally with second slider 53 with respect to first fixed section 51. Second locking section 55 and second slider 53 are connected via spring 57, and spring 57 biases second locking section 55 in a direction away from second slider 53.

Second locking section 55 includes pivot support section 55a and claw section 55b. Pivot support section 55a and claw section 55b have the same shape as swinging support section 54a and claw section 54b of first locking section 54, and claw section 55b protrudes toward the side opposite to second slider 53. Locking surface 55c faces the side opposite to the supply position and is substantially orthogonal to the X-axis direction during normal operation shown in FIG. 5. On the other hand, lock-release surface 55d faces the supply position and slopes toward second slider 53 as it moves away from locking surface 55c in the X-axis direction.

Claw section 55b provided to second locking section 55 is inserted into return-side slit 45a from inner wall section 41 side during normal operation, and second locking section 55 slides in the X-axis direction in a state in which claw section 55b is inserted into return-side slit 45a. Claw section 55b is pulled out of return-side slit 45a by pivoting second locking section 55 against the urging force of spring 56.

Tape return prevention section 60 mainly includes second fixed section 61 and third locking section 62. Second fixed section 61 is provided in an upright state at a position facing the outer peripheral surface of the portion of outer wall section 42 where feed-side guide 43 is formed.

Third locking section 62 is disposed between second fixed section 61 and outer wall section 42, and is supported so as to be pivotable about an axis parallel to the Z-axis direction. Third locking section 62 and second fixed section 61 are connected via spring 63, and spring 63 biases third locking section 62 in a direction away from second fixed section 61.

Third locking section 62 includes pivot support section 62a and claw section 62b. Pivot support section 62a and claw section 62b have the same shape as pivot support sections 54a, 55a and claw sections 54b, 55b of first locking section 54 and second locking section 55, and claw section 62b protrudes to the side opposite to second fixed section 61. Locking surface 62c faces the supply position and is generally orthogonal to the X-axis direction during normal operation. On the other hand, unlocking surface 62d faces the side opposite to the supply position and slopes toward second fixed section 61 as it moves away from locking surface 62c in the X-axis direction.

Claw section 62b provided in third locking section 62 is inserted into feed-side slit 43a from the outer wall section 42 side during normal operation. Further, claw section 62b is pulled out of return-side slit 45a by pivoting third locking section 62 against the urging force of spring 56.

3. Operation of Tape Feeder 21

Next, the operation of tape feeder 21 will be described. A cylinder device (not shown) for sliding first slider 52 in the X-axis direction is connected to first slider 52. When the cylinder device is driven so that first slider 52 slides in a direction approaching the supply position, tape feeding section 50 slides in a direction in which second slider 53 moves away from the supply position. Similarly, when the cylinder device is driven so that first slider 52 slides in the direction away from the supply position, tape feeding section 50 slides in the direction in which second slider 53 approaches the supply position.

When the cylinder device is driven so that first slider 52 slides in the direction approaching the supply position while carrier tape 100 is disposed in guide section 40, two first locking sections 54 slide in the direction approaching the supply position, and second locking section 55 slides in the direction away from the supply position.

At this time, claw sections 54b of two first locking sections 54 inserted into feed-side slit 43a are inserted into feed holes 102 of carrier tape 100 guided by feed-side guide 43. Similarly, claw section 55b of second locking section 55 inserted into return-side slit 45a is inserted into feed hole 102 of carrier tape 100 guided by return-side guide 45. Locking surfaces 54c of first locking sections 54 facing the supply position and locking surface 55c of second locking section 55 facing the side opposite to the supply position then engage with the inner peripheral surface of feed holes 102. In this state, by moving second locking section 55 in a direction away from the supply position, carrier tape 100 is fed in the direction in which first locking section 54 approaches the supply position, and radial lead components 110 held by carrier tape 100, guided by feed-side guide 43, are fed one by one to the supply position.

On the other hand, in a case in which carrier tape 100 is fed by first locking section 54 and second locking section 55, and claw section 62b of third locking section 62 inserted into feed-side slit 43a is inserted into feed hole 102, lock-release surface 62d comes into contact with the inner peripheral surface of feed hole 102. At this time, when locking release surface 62d is pushed toward the supply position side by the inner peripheral surface of feed hole 102, third locking section 62 pivots, and claw section 62b comes out of feed hole 102. As a result, tape feeding section 50 can smoothly feed carrier tape 100 without being hindered by third locking section 62.

When first locking section 54 and second locking section 55 slide by a constant amount, radial lead component 110 is disposed at the supply position. Subsequently, component transfer device 30 holds by suction, with component holding section 34, the upper face of component main body 111 of radial lead component 110 supplied to the supply position. Thereafter, tape feeder 21 cuts lead 112 of radial lead component 110 suction and held by component holding section 34 with cutting device 70, and component transfer device 30 mounts held radial lead component 110 onto board K.

Thereafter, when tape feeder 21 feeds carrier tape 100 with tape feeding section 50, it is necessary to return the positions of first locking section 54 and second locking section 55 to their original positions (i.e., the positions before carrier tape 100 was fed). Therefore, tape feeder 21 drives the cylinder device (not shown) so that first slider 52 slides in the direction away from the supply position. As a result, two first locking sections 54 start to slide in the direction away from the supply position and second locking section 55 starts to slide in the direction toward the supply position.

At this time, since claw sections 54b of first locking sections 54 and claw section 55b of second locking section 55 are inserted into feed holes 102, carrier tape 100 moves in a direction opposite to the feed direction of carrier tape 100 in conjunction with the sliding of first locking section 54 and second locking section 55.

On the other hand, when claw section 62b of third locking section 62 is inserted into feed hole 102 of carrier tape 100 guided by feed side guide 43, locking surface 62c of third locking section 62 facing the supply position comes into contact with the inner peripheral surface of feed hole 102. As a result, carrier tape 100 is restricted from moving in the direction opposite to the feed direction of carrier tape 100 due the inner peripheral surface of feed hole 102, into which claw section 62b is inserted, being engaged with locking surface 62c.

Accordingly, claw sections 54b of first locking sections 54 inserted into feed hole 102 are pushed to the inner peripheral surface of feed holes 102 by lock-release surfaces 54d coming into contact with the inner peripheral surface of feed holes 102. First locking sections 54 then pivot, and claw sections 54b come out of feed holes 102. Similarly, claw section 55b of second engaging section 55 inserted into feed hole 102 is pushed to the inner peripheral surface of feed hole 102 by lock-release surface 55d coming into contact with the inner peripheral surface of feed hole 102. Second locking section 55 then pivots, and claw section 55b comes out of feed hole 102. Therefore, tape feeding section 50 can prevent carrier tape 100 from moving in the direction opposite to the feed direction when first locking sections 54 and second locking section 55 are returned to their original positions.

In this manner, first locking sections 54 and second locking section 55 are provided with claws sections 54b, 55b engageable with feed holes 102. Tape feeding section 50 then feeds carrier tape 100 by sliding first locking sections 54 and second locking section 55 while claw sections 54b of first locking sections 54 and claw section 55b of second locking section 55 are engaged with feed holes 102. On the other side, third locking section 62 includes claw section 62b engageable with feed hole 102. Tape return prevention section 60 prevents carrier tape 100 from moving in the direction opposite to the feed direction by engaging claw section 62b of third locking section 62 with feed hole 102. In this way, tape feeder 21 can supply radial lead components 110 one by one to the supply position.

4. Setting the Target Position

Next, setting of the target position of component holding section 34 when holding radial lead component 110 will be described. As described above, the target position of component holding section 34 is calculated by position control section 35.

Figure 8:
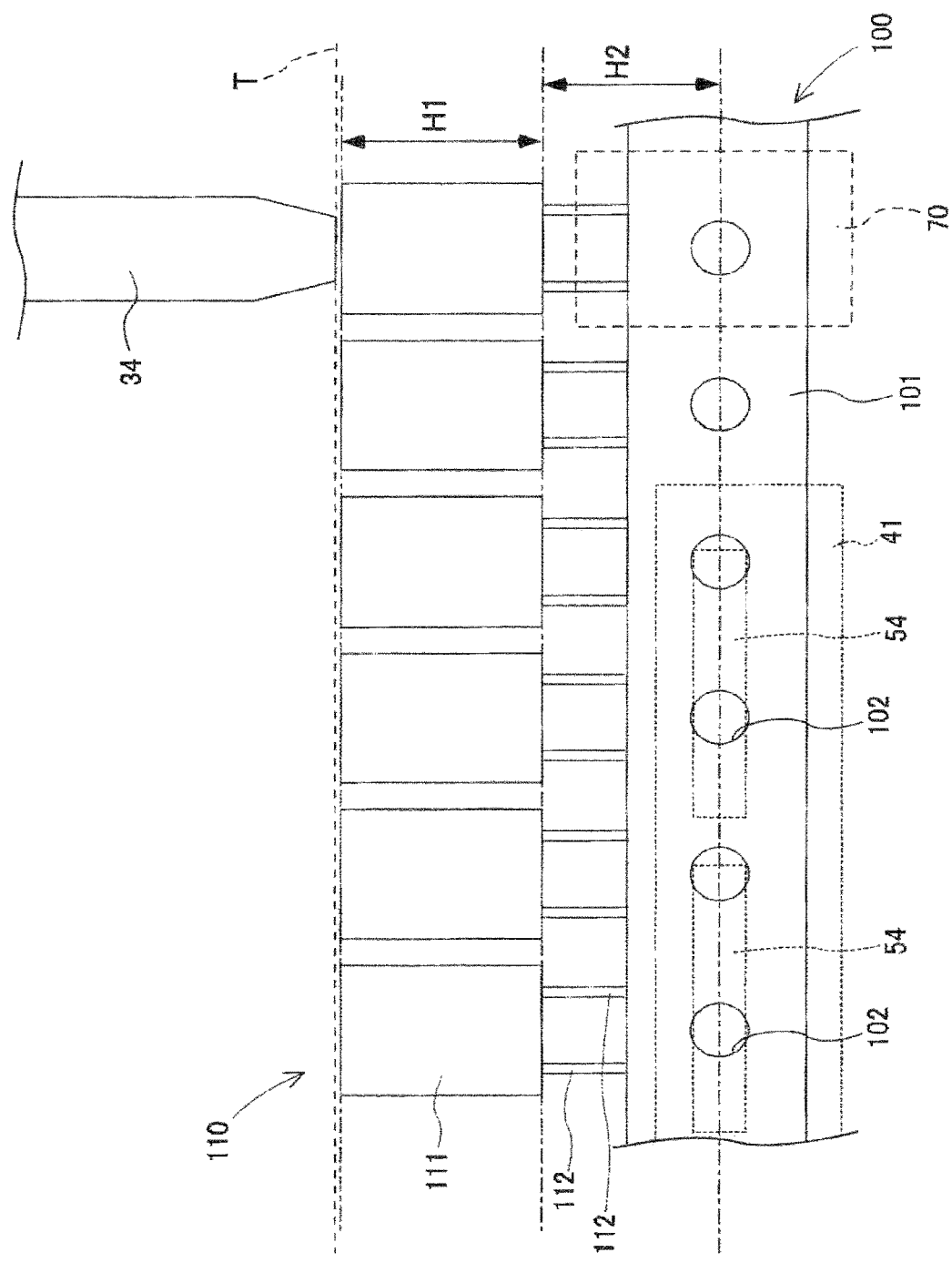
FIG. 8 A diagram describing a method for calculating the target position of a component holding section when a radial lead component is held by a suction nozzle which is a component holding section.

As shown in FIG. 8, component holding section 34 holds the upper face of component main body 111 by suction when holding radial lead component 110. Therefore, position control section 35 sets the upper face of component main body 111 of radial lead component 110, supplied to the supply position, as the target position, with radial lead component 110 being held by carrier tape 100. Target position calculation section 37 then calculates the target position based on first height H1 and second height H2 inputted by the operator.

Here, inputting of first height H1 and second height H2 is performed by the operator. In particular, second height H2 varies among carrier tapes 100, and the variation causes component holding errors, in which component main body 111 cannot be held by component holding section 34, or damage to radial lead component 110 from contact between component holding section 34 and component main body 111.

On the other hand, the operator measures actual second height H2 and inputs the measured value to second height input section 36b. When component holding section 34 sucks the upper face of component main body 111, radial lead component 110 is held by carrier tape 100, and first locking sections 54 and second locking section 55 are inserted into feed holes 102 of carrier tape 100. Therefore, tape feeder 21 can arrange the center position of feed hole 102 in feed-side guide 43 at a constant height position while radial lead component 110 is supplied to the supply position.

Therefore, position control section 35 can accurately set the target position by setting the measured value of the length from the center of feed hole 102 to the lower end of component main body 111 as second height H2 and calculating the target position based on first height H1 and second height H2. In this manner, component mounting machine 1 can minimize errors that occur when a radial lead component is held by performing a simple setting of inputting first height H1 and second height H2.

5. Other

Although the present disclosure has been described based on the above-described embodiment, the present disclosure is not limited to the above-described embodiment, and it can be easily inferred that various modifications and improvements can be made within a scope not departing from the spirit of the present disclosure.

Figure 9:
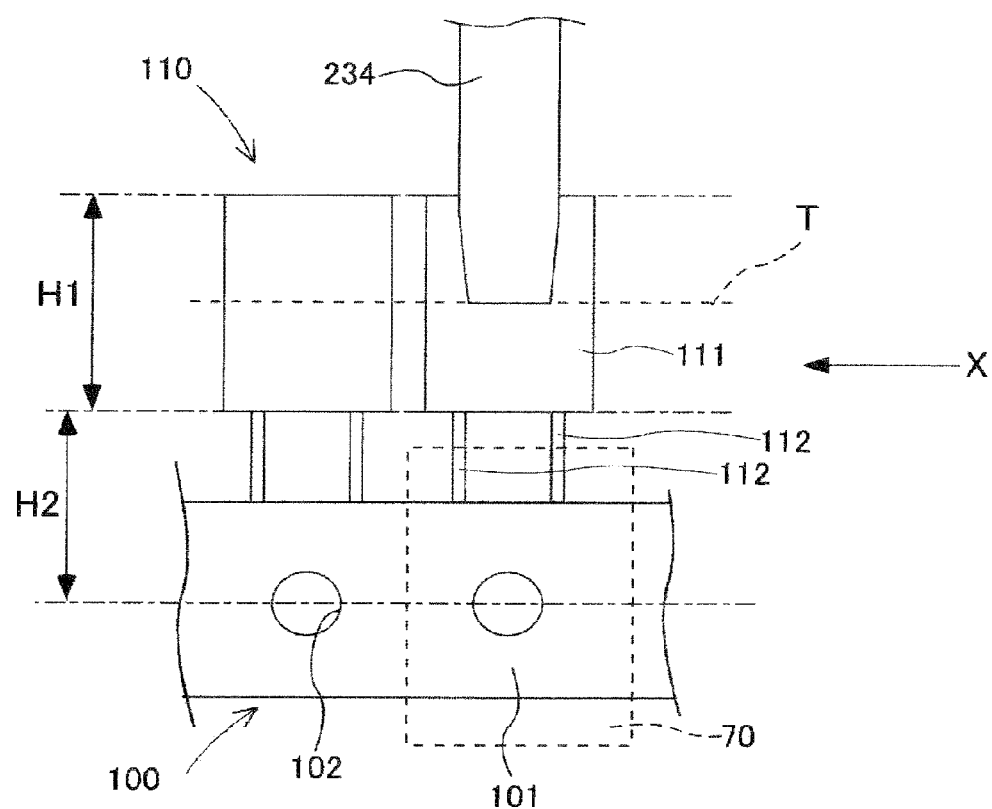
FIG. 9 A diagram describing a method for calculating the target position of a component holding section when the radial lead component is held by a pair of locking claws functioning as a component holding section.
Figure 10:
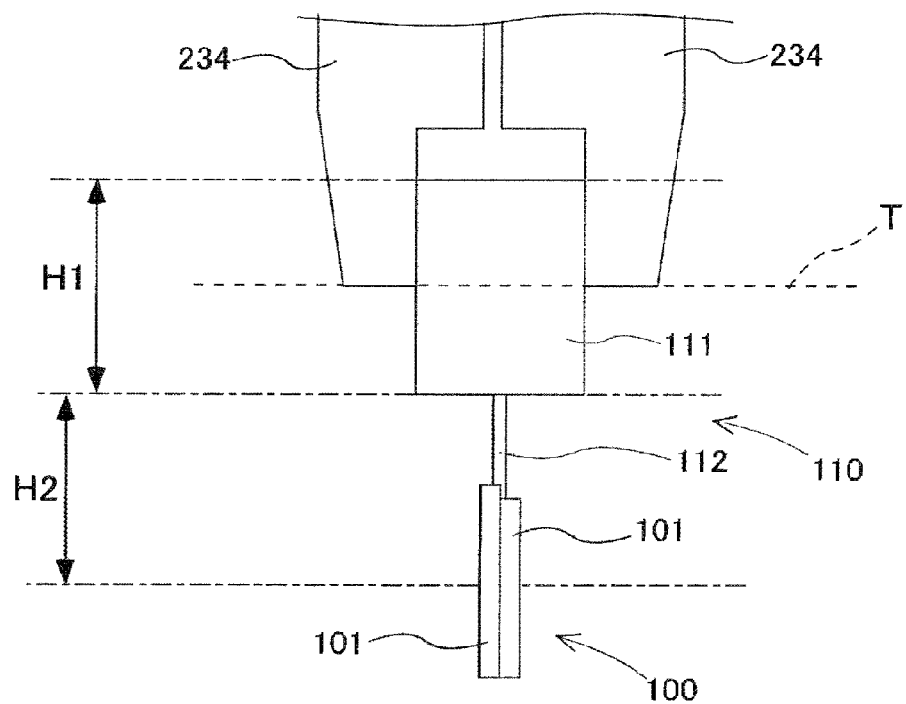
FIG. 10 A view showing a state of a component main body being held by a pair of holding claws, from the X-direction shown in FIG. 9.

For example, in the above embodiment, a case where the suction nozzle for holding the upper face of component main body 111 by suction is component holding section 34 has been described, but the present disclosure is not limited thereto. That is, as shown in FIGS. 9 and 10, a pair of holding claws for holding component main body 111 may be used as component holding section 234. In this case, position control section 35 sets the center portion in the height direction of component main body 111 as the target position, and calculates the target position based on first height H1 and second height H2 inputted to information input section 36. Therefore, even in this case, the component mounting machine can minimize errors that occur when the radial lead component is held by performing a simple setting of inputting first height H1 and second height H2.

In the present embodiment, the case where component transfer device 30 includes position control section 35 and the target position of component holding section 34 when holding radial lead component 110 is set by position control section 35 has been described, but the present disclosure is not limited thereto. That is, an external terminal, such as a personal computer, provided outside component mounting device 1 may have a function corresponding to position control section 35, and an operator at the external terminal may edit data relating to the target position of component holding section 34 when radial lead component 110 is held and transmit the edited data from the external terminal to component mounting device 1.

REFERENCE SIGNS LIST

1: Electronic component mounting machine (component mounting machine), 20: Component supply device, 30: Component transfer device, 34, 234: Component holding section, 35: Position control section, 50: Tape feeding section, 54: First locking section, 55: Second locking section, 100: Carrier tape, 102: Feed hole, 110: Radial lead component, 111: Component main body, 112: Lead

The invention claimed is:

1. An electronic component mounting machine, comprising:
a component supply device configured to supply a radial lead component to a supply position by feeding a carrier tape holding multiple radial lead components, the carrier tape includes multiple feed holes at intervals in a longitudinal direction, each radial lead component consisting of a component main body and leads extending downward from the component main body, the component supply device including a locking section engageable with the feed holes, and a tape feeder configured to feed the carrier tape by sliding the locking section in engagement with the feed holes;
a component transfer device including a component holder, the component holder configured to hold the component main body of the radial lead component held by the carrier tape, the component transfer device configured to collect the radial lead component supplied to the supply position and mount the radial lead component to a predetermined mounting position while the component holder holds the component and moves along at least two axes,
an information input section configured to receive information input by an operator including a first height from an upper end to a lower end of the component main body and a second height from the lower end of the component main body to a center of the feed hole, the first height and the second height being based on actual measurements of the radial lead components made by the operator; and
a processing circuitry configured to control a position of the component holder via a component holder driving and moving mechanism, the processing circuitry calculating a target position of the component holder to hold the component main body based on the first height and the second height input by the operator via the information input section.

2. The electronic component mounting machine of claim 1, wherein the component holder is a suction nozzle that holds the component main body by suction.

3. The electronic component mounting machine of claim 1, wherein the component holder is a pair claws that hold the component main body by gripping the component main body.

* * * * *